US010926439B2

(12) United States Patent
Lowe

(10) Patent No.: US 10,926,439 B2
(45) Date of Patent: *Feb. 23, 2021

(54) OVERMOLDED ELECTRONIC COMPONENTS FOR TRANSACTION CARDS AND METHODS OF MAKING THEREOF

(71) Applicant: CompoSecure, LLC, Somerset, NJ (US)

(72) Inventor: Adam Lowe, Somerset, NJ (US)

(73) Assignee: CompoSecure, LLC, Somerset, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/783,504

(22) Filed: Feb. 6, 2020

(65) Prior Publication Data

US 2020/0171723 A1    Jun. 4, 2020

Related U.S. Application Data

(63) Continuation of application No. 16/441,363, filed on Jun. 14, 2019, now Pat. No. 10,583,594, which is a
(Continued)

(51) Int. Cl.
*B29C 45/14* (2006.01)
*G06K 19/077* (2006.01)
(Continued)

(52) U.S. Cl.
CPC ........ *B29C 45/14647* (2013.01); *B22D 19/00* (2013.01); *B29C 45/14* (2013.01); *B29C 45/14639* (2013.01); *B29C 45/17* (2013.01); *G06K 19/077* (2013.01); *G06K 19/07745* (2013.01); *G06K 19/07749* (2013.01); *G06K 19/07777* (2013.01); *H01Q 13/10* (2013.01);
(Continued)

(58) Field of Classification Search
CPC ........ B29C 45/14639; B29C 45/14647; B22D 19/00; G06K 19/07745; G06K 19/07794
USPC ..................................................... 235/492
See application file for complete search history.

(56) References Cited

U.S. PATENT DOCUMENTS

| 3,802,101 A | 4/1974 | Scantlin |
| 4,737,620 A | 4/1988 | Mollet et al. |

(Continued)

FOREIGN PATENT DOCUMENTS

| CA | 2347818 A1 | 5/2000 |
| CA | 2860909 A1 | 8/2013 |

(Continued)

OTHER PUBLICATIONS

International Search Report and Written Opinion for International Application No. PCT/US2020/034661, dated Sep. 1, 2020, 16 pages.
(Continued)

*Primary Examiner* — Allyson N Trail
(74) *Attorney, Agent, or Firm* — RatnerPrestia

(57) ABSTRACT

A transaction card having an opening in a metal card body, a booster antenna in the opening, and a molding material about the booster antenna. A process for manufacturing the transaction card includes forming an opening in a card body, inserting a booster antenna into the opening, and molding a molding material about the booster antenna.

25 Claims, 5 Drawing Sheets

Related U.S. Application Data continuation of application No. 16/164,322, filed on Oct. 18, 2018, now Pat. No. 10,406,734, which is a continuation of application No. PCT/US2017/043954, filed on Jul. 26, 2017.

(60) Provisional application No. 62/367,362, filed on Jul. 27, 2016.

(51) Int. Cl.

| | | |
|---|---|---|
| *H01Q 13/10* | (2006.01) | |
| *H05K 1/18* | (2006.01) | |
| *H05K 3/28* | (2006.01) | |
| *H05K 3/30* | (2006.01) | |
| *B22D 19/00* | (2006.01) | |
| *B29C 45/17* | (2006.01) | |
| *B29L 17/00* | (2006.01) | |

(52) U.S. Cl.
CPC .............. *H05K 1/18* (2013.01); *H05K 3/284* (2013.01); *H05K 3/285* (2013.01); *H05K 3/301* (2013.01); *B29L 2017/006* (2013.01); *H05K 2201/1003* (2013.01); *H05K 2203/1316* (2013.01); *H05K 2203/1327* (2013.01)

(56) References Cited

U.S. PATENT DOCUMENTS

| | | |
|---|---|---|
| 5,013,900 A | 5/1991 | Hoppe |
| 5,574,309 A | 11/1996 | Papapietro et al. |
| 5,598,032 A | 1/1997 | Fidalgo |
| 5,681,356 A | 10/1997 | Barak et al. |
| 5,774,339 A | 6/1998 | Ohbuchi et al. |
| 5,935,497 A | 8/1999 | Rose |
| 6,065,681 A | 5/2000 | Trueggelmann |
| D529,955 S | 10/2006 | Allard et al. |
| 7,237,724 B2 | 7/2007 | Singleton |
| 7,701,350 B2 | 4/2010 | Sakama et al. |
| 7,762,470 B2 | 7/2010 | Finn et al. |
| 7,823,777 B2 | 11/2010 | Varga et al. |
| 7,936,273 B2 | 5/2011 | Kobayashi et al. |
| 7,954,228 B2 | 6/2011 | Kobayashi et al. |
| 8,128,000 B2 | 3/2012 | Forster |
| 8,141,786 B2 | 3/2012 | Bhandarkar et al. |
| 8,174,454 B2 | 5/2012 | Mayer |
| 8,226,013 B2 | 7/2012 | Phillips et al. |
| 8,248,240 B2 | 8/2012 | Osaki et al. |
| 8,261,997 B2 | 9/2012 | Gebhart |
| 8,448,872 B2 | 5/2013 | Droz |
| 8,519,905 B2 | 8/2013 | Tanaka et al. |
| 8,608,082 B2 | 12/2013 | Le Garrec et al. |
| 8,622,311 B2 | 1/2014 | Hamedani et al. |
| 8,698,633 B2 | 4/2014 | Kobayashi et al. |
| 8,725,589 B1 | 5/2014 | Skelding et al. |
| 8,786,510 B2 | 7/2014 | Coleman et al. |
| 8,789,762 B2 | 7/2014 | Finn et al. |
| 8,978,987 B2 | 3/2015 | Scarlatella |
| 9,000,619 B2 | 4/2015 | Kato et al. |
| 9,251,458 B2 | 2/2016 | Finn et al. |
| 9,320,186 B2 | 4/2016 | Droz |
| 9,390,364 B2 | 7/2016 | Finn et al. |
| 9,390,366 B1 | 7/2016 | Herslow et al. |
| 9,475,086 B2 | 10/2016 | Finn et al. |
| 9,489,613 B2 | 11/2016 | Finn et al. |
| 9,622,359 B2 | 4/2017 | Finn et al. |
| 9,634,391 B2 | 4/2017 | Finn et al. |
| 9,697,459 B2 | 7/2017 | Finn et al. |
| 9,721,200 B2 | 8/2017 | Herslow et al. |
| D797,188 S | 9/2017 | Hendrick |
| 9,760,816 B1 | 9/2017 | Williams et al. |
| 9,798,968 B2 | 10/2017 | Finn et al. |
| 9,812,782 B2 | 11/2017 | Finn et al. |
| 9,836,684 B2 | 12/2017 | Finn et al. |
| 9,898,699 B2 | 2/2018 | Herslow et al. |
| D812,137 S | 3/2018 | Daniel et al. |
| 10,032,099 B2 | 7/2018 | Mosteller |
| 10,089,570 B2 | 10/2018 | Herslow et al. |
| 10,140,569 B2 | 11/2018 | Kim et al. |
| 10,147,999 B2 | 12/2018 | Wang et al. |
| 10,193,211 B2 | 1/2019 | Finn et al. |
| 10,339,434 B2 | 7/2019 | Cox |
| 10,445,627 B1 | 10/2019 | Sexl et al. |
| 2002/0190132 A1* | 12/2002 | Kayanakis ........ G06K 19/07749 235/492 |
| 2003/0038174 A1* | 2/2003 | Jones ............... G06K 19/07728 235/380 |
| 2003/0102541 A1 | 6/2003 | Gore et al. |
| 2005/0087609 A1 | 4/2005 | Martin |
| 2006/0102729 A1 | 5/2006 | Gandel et al. |
| 2006/0219776 A1 | 10/2006 | Finn |
| 2006/0226240 A1 | 10/2006 | Singleton |
| 2007/0075132 A1 | 4/2007 | Kean |
| 2008/0001759 A1 | 1/2008 | Kobayashi et al. |
| 2012/0044693 A1 | 2/2012 | Hatase et al. |
| 2012/0201994 A1 | 8/2012 | Michalk |
| 2012/0206869 A1 | 8/2012 | Droz |
| 2013/0062875 A1 | 3/2013 | Le Loarer et al. |
| 2013/0102113 A1 | 4/2013 | Yang |
| 2013/0228628 A1 | 9/2013 | Bona et al. |
| 2013/0255078 A1 | 10/2013 | Cox |
| 2014/0158773 A1 | 6/2014 | Blum |
| 2014/0279555 A1 | 9/2014 | Guillaud |
| 2014/0361086 A1 | 12/2014 | Finn et al. |
| 2015/0021403 A1 | 1/2015 | Finn et al. |
| 2015/0129665 A1 | 5/2015 | Finn et al. |
| 2015/0136858 A1 | 5/2015 | Finn et al. |
| 2015/0180229 A1 | 6/2015 | Herslow |
| 2015/0235063 A1 | 8/2015 | Loussert |
| 2015/0235122 A1 | 8/2015 | Finn et al. |
| 2015/0269474 A1 | 9/2015 | Finn et al. |
| 2015/0269477 A1 | 9/2015 | Finn et al. |
| 2015/0278675 A1 | 10/2015 | Finn et al. |
| 2015/0339564 A1 | 11/2015 | Herslow et al. |
| 2016/0110639 A1 | 4/2016 | Finn et al. |
| 2016/0203399 A1 | 7/2016 | Cox |
| 2016/0229081 A1 | 8/2016 | Williams et al. |
| 2016/0365644 A1 | 12/2016 | Finn et al. |
| 2017/0017871 A1 | 1/2017 | Finn et al. |
| 2017/0077589 A1 | 3/2017 | Finn et al. |
| 2017/0106572 A1 | 4/2017 | Cepress et al. |
| 2017/0243104 A1 | 8/2017 | Cox |
| 2017/0262749 A1 | 9/2017 | Cox |
| 2017/0316300 A1 | 11/2017 | Herslow et al. |
| 2018/0068212 A1 | 3/2018 | Williams et al. |
| 2018/0157954 A1 | 6/2018 | Herslow et al. |
| 2018/0204105 A1 | 7/2018 | Herslow et al. |
| 2018/0307962 A1 | 10/2018 | Lowe et al. |
| 2018/0339503 A1 | 11/2018 | Finn et al. |
| 2018/0341846 A1 | 11/2018 | Finn et al. |
| 2018/0341847 A1 | 11/2018 | Finn et al. |
| 2018/0349751 A1 | 12/2018 | Herslow et al. |
| 2019/0050706 A1 | 2/2019 | Lowe |
| 2019/0114526 A1 | 4/2019 | Finn et al. |
| 2019/0130242 A1 | 5/2019 | Fu et al. |
| 2019/0156073 A1 | 5/2019 | Finn et al. |
| 2019/0156994 A1 | 5/2019 | Cox |
| 2019/0197381 A1 | 6/2019 | Cox |
| 2019/0204812 A1 | 7/2019 | Cox |
| 2019/0206161 A1 | 7/2019 | Cox |
| 2019/0236434 A1 | 8/2019 | Lowe |
| 2019/0279065 A1 | 9/2019 | Cox |
| 2019/0300695 A1 | 10/2019 | Cox |

FOREIGN PATENT DOCUMENTS

| | | |
|---|---|---|
| DE | 19703122 C1 | 5/1998 |
| DE | 19848193 C1 | 11/1999 |
| DE | 19934434 A1 | 2/2001 |
| DE | 10132893 A1 | 1/2003 |
| DE | 102007016777 A1 | 10/2008 |
| DE | 102008053582 B3 | 4/2010 |
| EP | 2133828 A2 | 12/2009 |
| EP | 2722193 A1 | 4/2014 |

(56) References Cited

FOREIGN PATENT DOCUMENTS

| | | |
|---|---|---|
| EP | 2765648 A1 | 8/2014 |
| EP | 3009964 A1 | 4/2016 |
| JP | 63072596 A | 4/1988 |
| JP | 63185688 A | 8/1988 |
| JP | 63239097 A | 10/1988 |
| JP | 021397 A | 1/1990 |
| JP | 07501758 A | 2/1995 |
| JP | 08276459 A | 10/1996 |
| JP | 10291392 A | 11/1998 |
| KR | 20010080890 A | 8/2001 |
| KR | 20140117614 A | 10/2014 |
| WO | 9809252 A1 | 3/1998 |
| WO | 2013110625 A1 | 8/2013 |
| WO | 2015071017 A1 | 5/2015 |
| WO | 2015071086 A1 | 5/2015 |
| WO | 2015144261 A1 | 10/2015 |
| WO | 2016020067 A1 | 2/2016 |
| WO | 2016046184 A1 | 3/2016 |
| WO | 2017007468 A1 | 1/2017 |
| WO | 2017090891 A1 | 6/2017 |
| WO | 2017177906 A1 | 10/2017 |
| WO | 2018022755 A1 | 2/2018 |
| WO | 2018138432 A1 | 8/2018 |

OTHER PUBLICATIONS

International Preliminary Report on Patentability for International Application No. PCT/US2017/043954, dated Jan. 29, 2019, 6 pages.
International Search Report and Written Opinion for International Application No. PCT/US2017/043954, dated Oct. 5, 2017, 6 pages.
International Search Report and Written Opinion for International Application No. PCT/US2019/056704, dated Dec. 18, 2019, 11 pages.
Third Party Submission Under 37 CFR 1.290 Concise Statement of Relevance, dated Oct. 15, 2019, 13 pages.
Third Party Submission Under 37 CFR 1.290 filed in U.S. Appl. No. 15/928,813 Concise Description of Relevance dated Oct. 27, 2019, 13 pages.
Third Party Submission Under 37 CFR 1.290 filed in U.S. Appl. No. 15/928,813 Concise Description of Relevance dated Nov. 1, 2019, 8 pages.
Non Final Office Action for U.S. Appl. No. 16/441,363, dated Aug. 8, 2019, 23 pages.
Final Office Action for U.S. Appl. No. 16/164,322, dated Apr. 11, 2019—20 pages.
Non Final Office Action for U.S. Appl. No. 29/663,230, dated Jul. 25, 2019, 19 pages.
International Search Report and Written Opinion for International Application No. PCT/US2019/014656, dated Apr. 1, 2019, 16 pages.
Chen et al., "A Metallic RFID Tag Design for Steel-Bar and Wire-Rod Management Application in the Steel Industry", Progress in Electromagnetics Research, PIER 91, 2009, pp. 195-212.
Extended European Search Report for European Application No. 17835207.6, dated Mar. 10, 2020, 12 pages.
International Preliminary Report on Patentability for International Application No. PCT/US2018/049899, dated Mar. 10, 2020, 8 pages.
Japanese Notice of Reasons for Rejection for Japanese Application No. 2019-504037, dated Mar. 10, 2020 with translation, 7 pages.
Non Final Office Action for U.S. Appl. No. 15/928,813, dated Apr. 15, 2020, 51 pages.
Korean Office Action for Korean Application No. 10-2019-7005614, dated Apr. 17, 2020 with translation, 14 pages.
Non Final Office Action for U.S. Appl. No. 16/124,711, dated May 1, 2020, 31 pages.
International Preliminary Report on Patentability for International Application No. PCT/US2018/052832, dated Apr. 21, 2020, 9 pages.
Final Office Action for U.S. Appl. No. 16/124,711, dated Aug. 7, 2020, 18 pages.
Japanese Decision of Final Rejection for Japanese Application No. 2019-504037, dated Oct. 6, 2020 with translation, 5 pages.
European Communication Pursuant to Article 94(3) for European Application No. 17835207.6, dated Oct. 23, 2020, 6 pages.
Non Final Office Action for U.S. Appl.No. 16/427,864, dated Nov. 4, 2020, 56 pages.

* cited by examiner

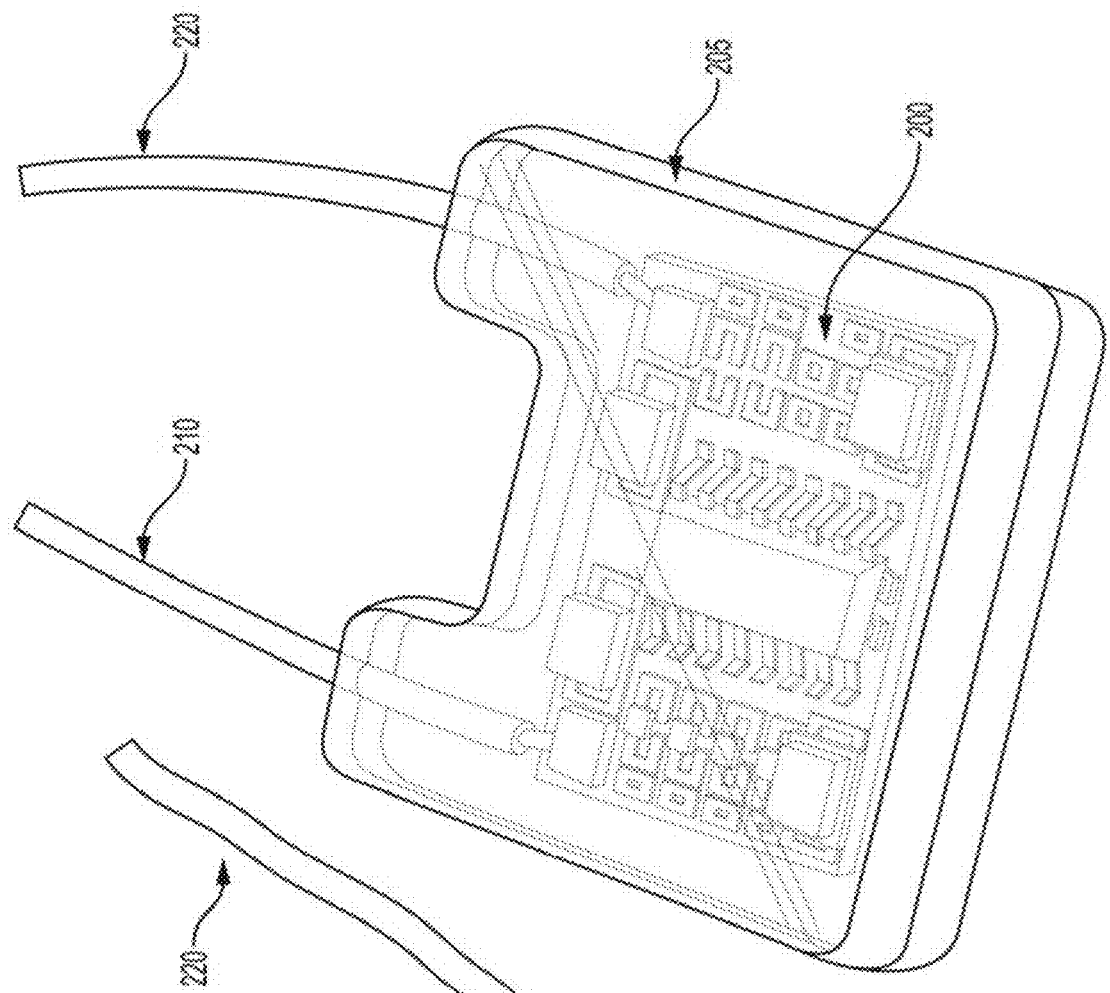
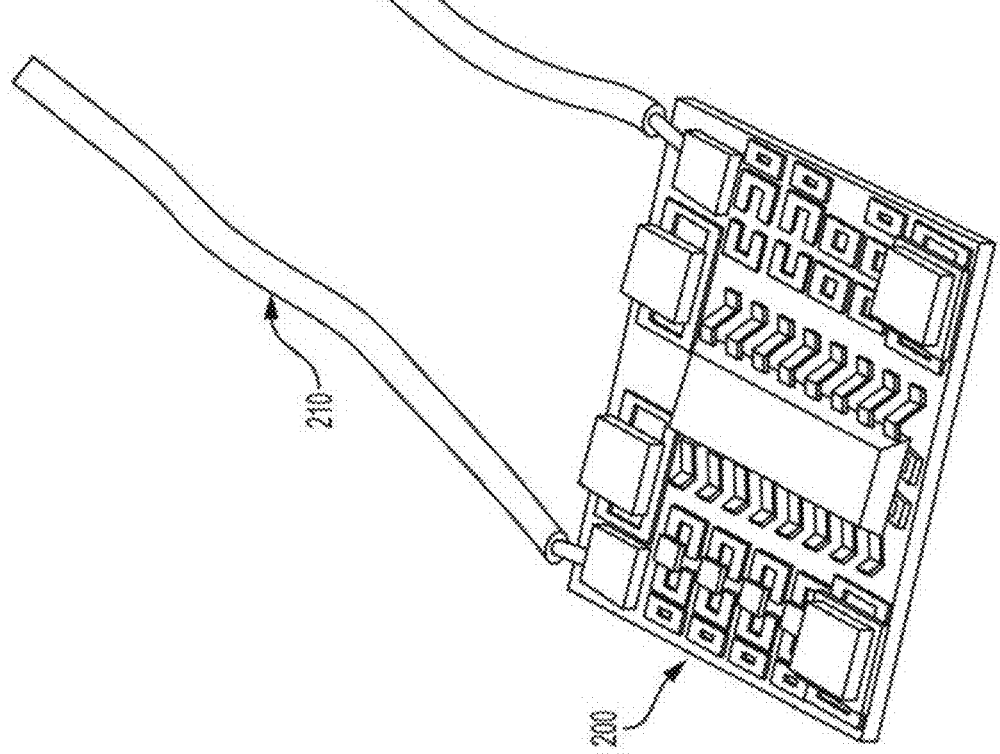
FIG. 2B
FIG. 2A

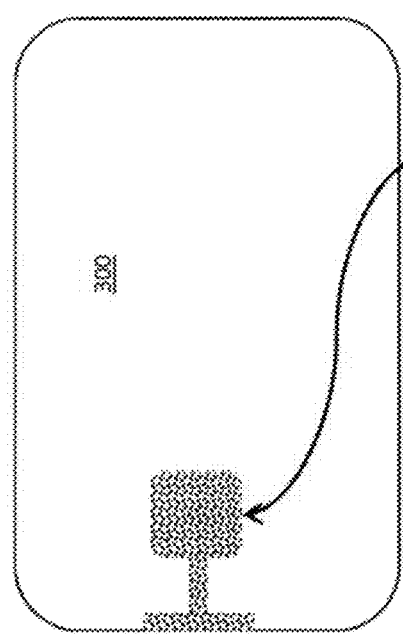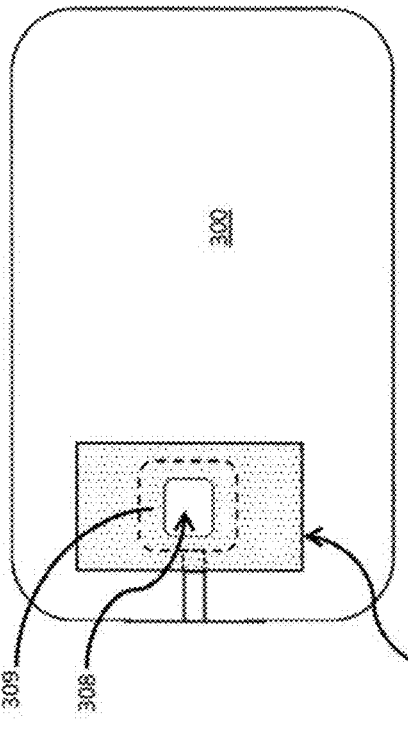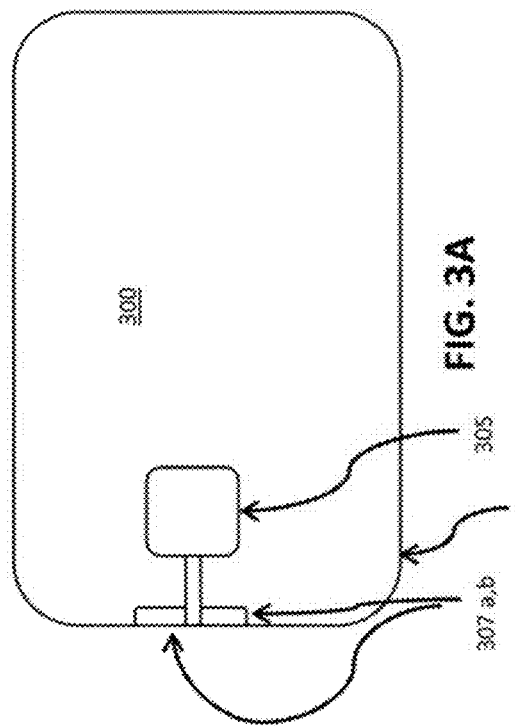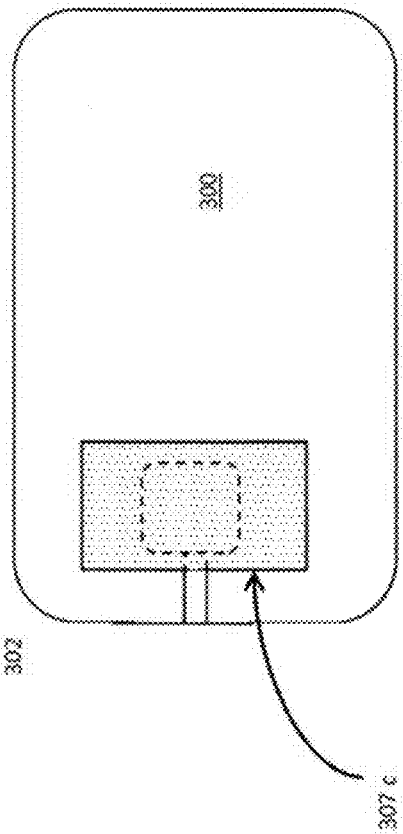

OVERMOLDED ELECTRONIC COMPONENTS FOR TRANSACTION CARDS AND METHODS OF MAKING THEREOF

CROSS-REFERENCE TO RELATED APPLICATIONS

This application is a continuation of U.S. application Ser. No. 16/441,363, filed 14 Jun. 2019, which is a continuation of U.S. application Ser. No. 16/164,322, filed 18 Oct. 2018 (status: granted as U.S. Pat. No. 10,406,734), which is a U.S. national phase application and continuation-in-part of PCT Application No. PCT/US2017/043954, filed 26 Jul. 2017, which claims priority to U.S. Provisional Application No. 62/367,362, titled OVERMOLDED ELECTRONIC COMPONENTS FOR TRANSACTION CARDS AND METHODS OF MAKING THEREOF, filed 27 Jul. 2016, the contents of which all are incorporated herein by reference in their entirety for all purposes.

FIELD OF THE INVENTION

This invention relates to transaction cards with electronic components and methods for producing the same.

BACKGROUND OF THE INVENTION

Metal payment cards present unique challenges when including electronic components, such as inductive coupling payment modules, RF electronics, and standalone electronic inlays. To accommodate these components, the metal is machined into various geometries, then the component is placed in the cavity and left exposed or hidden under a printed sheet of plastic or other decorative element. The decorative element may be affixed to the card through a variety of processes such as platen lamination, contact adhesive, curable adhesives, or "push fit" or any joining method known to the art. RF shielding is often required in the cavity, further complicating card assembly while maintaining the desired aesthetic of the card.

Some of these required machining geometries remove significant amounts of metal or leave slits or holes through the card which weaken its strength and are undesirable aesthetically. In order to strengthen the card and provide a desirable surface, overmolding and insert molding techniques have been developed to encapsulate electronic inlays within the cards and strengthen the card geometries. Furthermore, this development has improved RF performance over existing designs because it enables more metal remove in critical RF transmission and receiving areas while maintaining structural rigidity and desired appearance.

SUMMARY OF THE INVENTION

Aspects of the invention relate to transaction cards, processes for manufacturing transaction cards, as well as transaction cards produced according to the disclosed methods.

In accordance with one aspect, the invention provides for a process for manufacturing a transaction card and a transaction card produced thereby. The process includes forming an opening in a card body of the transaction card for receiving a booster antenna, inserting the booster antenna into the opening, and molding a molding material about the booster antenna.

In yet another aspect, the invention provides a transaction card. The transaction card includes a booster antenna.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings, with like elements having the same reference numerals. When a plurality of similar elements is present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures:

FIG. 2A is a photograph depicting an electronic component before overmolding in accordance with aspects of the present invention;

FIG. 2B is a photograph depicting an electronic component after overmolding in accordance with aspects of the present invention;

FIG. 3A is a schematic illustration of the front of a transaction card prior to insertion molding in accordance with aspects of the present invention;

FIG. 3B is a schematic illustration of the rear of a transaction card prior to insertion molding in accordance with aspects of the present invention;

FIG. 3C is a schematic illustration of the front of a transaction card after to insertion molding in accordance with aspects of the present invention; and FIG. 3D is a schematic illustration of the rear of a transaction card after to insertion molding in accordance with aspects of the present invention.

DETAILED DESCRIPTION OF THE INVENTION

Aspects of the invention relate to transaction cards, processes for manufacturing transaction cards, as well as transaction cards produced according to the disclosed methods.

Figure 1:
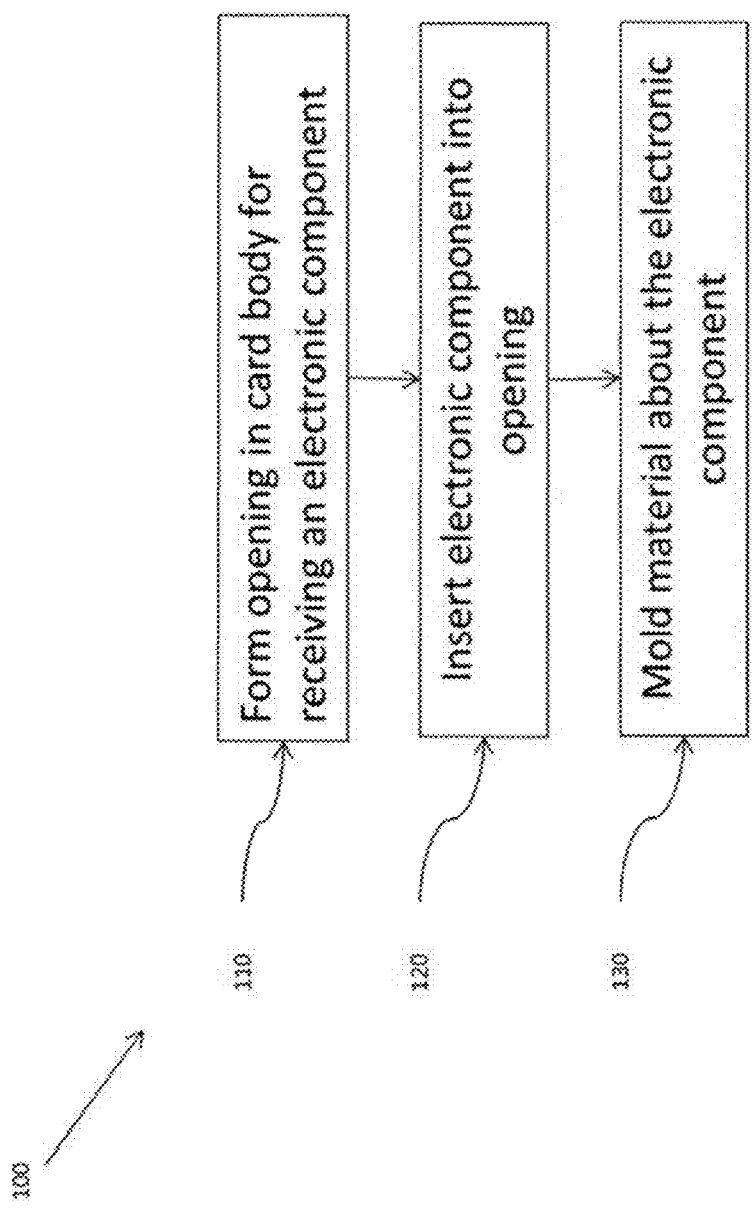
FIG. 1 is a flow diagram of selected steps of a process for manufacturing a transaction card in accordance with aspects of the present invention.

In FIG. 1, a flow diagram depicting selected steps of a process 100 for producing a transaction card according to aspects of the invention is shown. It should be noted that, with respect to the processes described herein, it will be understood from the description herein that one or more steps may be omitted and/or performed out of the described sequence of the process while still achieving the desired result.

In step 110, an opening is formed in the card body of the transaction card. The opening may be sized to accommodate one or more molded electronic components. The opening may extend partially (thereby forming, e.g., a pocket) or completely (thereby forming a hole) through the card body. In some embodiments, a hole formed through the card body may then be fully or partially covered on one side, such as with an applied material, such as an adhesively bonded plastic material, such as element 307c, shown in FIG. 3D. As depicted in FIG. 3D, element 307c overlaps an area surrounding the hole, to form a pocket bounded on the periphery by the edges of the hole in the card body and on a bottom end by the applied material 307c. The applied material may be a material that is the same or that is compatible with the molded material later to be filled in the pocket. In some embodiments, as shown in FIG. 3D, the applied material 307c overlapping the area surrounding the hole in the card body, may have a through-hole 308 having an area smaller than the hole in the card body, so as to provide a "ledge" 309 of applied material inside the periphery of the hole in the card body.

The card body of the present invention may be comprised or any suitable material including any suitable metal, such as stainless steel, bronze, copper, titanium, tungsten carbide, nickel, palladium, silver, gold, platinum, aluminum, or any alloy which gives the card most of its body (structure) and weight. Additionally, or alternatively, the card body described herein may be comprised of any suitable polymeric (e.g., polycarbonate, polyester) or inorganic (e.g., glass, ceramic) material, or any combination of any of the foregoing materials.

In step 120, an electronic component is inserted into the opening of the card body.

In step 130, a molding material is molded about the electronic component. It should be noted that the order of steps 120 and 130 may be varied depending on the particular application.

In one embodiment, step 130 includes an overmolding process. During the overmolding process, a molding material is molded about (and typically over) an electronic component such that the molding material covers at least a portion of a surface of the electronic component. Overmolding of electronic components may be accomplished using conventional and commercially available equipment, such as the ENGLE Insert (Engel Austria GmbH, Austria) and the Cavist MoldMan™ (Reno, Nev.).

An electronic component 201 is shown before (in FIG. 2A) and after (in FIG. 2B) an overmolding process. While the overmolded component 200 is depicted as having molding material 205 completely covering electronic component 201, one of ordinary skill in the art will understand that varying degrees of overmolding can achieve the desired structural rigidity, functionality, and aesthetic of the transaction card. In particular, as shown in FIGS. 2A and 2B, electrical contacts, in the form of wires 210 and 220 connected to component 200, each have an unencapsulated end that protrudes from the overmolding to permit electrical connection to the component. It should be understood, that, although depicted as wires in FIGS. 2A and 2B, the electrical contacts or other unencapsulated portions not limited to electrical contacts, may take any shape or form. It should be further understood that in certain embodiments, such as embodiments in which a technically desirable degree of coupling between unencapsulated and encapsulated components can be made through the encapsulation layer, the component may be completely encapsulated.

Returning to FIG. 1, where an overmolding process is employed, step 130 may be performed prior to performing step 120. That is, the electronic component may be separately overmolded prior to insertion into the opening of the card body. Prior to the insertion of the overmolded electronic component, the overmolded component may be further machined to remove excess molding material and/or to create features in the molding material which may be used to secure the overmolded electronic component into the opening of the card body. For example, with reference to FIG. 2B, a lip may be machined into molding material 205 so that overmolded component 200 may be secured into the opening of a card body.

Alternatively, overmolding in step 130 may be performed after performing step 120. In this embodiment, the electronic component is inserted into the opening of the card body. Subsequently, molding material is forced to flow into the opening of the card body and form over one or more exposed surfaces, including at least the top surface, of the electronic component. One of ordinary skill in the art will understand that when molding material flows into the opening of the card body, the card body material may be selected so as to withstand the pressure and heat associated with overmolding without substantially deforming.

Where an insert molding process is employed, step 130 may be performed before performing step 120. Conventional insert molding processes include inserting the electronic component into a mold, followed by the injection of molding material into the mold cavity to form the molded electronic component. The molded electronic component may be fully or partially encapsulated by molding material following an insert molding process.

Turning to FIGS. 3A-D, schematic illustrations of selected steps of an insert molding process for manufacturing a transaction card in accordance with aspects of the present invention are depicted. In the figures, areas 305 and 308 in FIGS. 3A-3D represent holes through the cards. Area 307a,b in FIG. 3A and area 307c in FIGS. 3B and 3D represent partially covered holes (pockets) in the card body for the molding material to bind and find purchase. FIG. 3B depicts the completed molded card in which the insert molded material of molded component 310 is visible. Although the insert molded material is shown contrasting with the background card materials for purposes of illustration, the molded component is not limited to any particular degree of contrast in coloration or shading relative to the background card, and may comprise the same materials as the front of the card or may comprise materials selected to have a coloration or shading selected to match the coloration or shading of the front side of the card so as to minimize its visibility in a completed card. For example, in a card body comprising materials different than the molding materials (e.g. a metal or ceramic body and thermoplastic resin molding materials), the coloration of the molding materials may be selected have a color and tone that matches as closely as possible the material of the body, including using constituents in the molding materials that are the same or similar to the card body materials (e.g. inclusion of a powdered metal in the molding materials that is the same as the metal of the body). In other embodiments, molding materials that contrast with the body of the card may be used. FIG. 3A depicts the front side of a transaction card 300 including an opening 305 which extends entirely through a card body 302. A plurality of securing features 307a, b provide areas to which the molding material can adhere or otherwise bind. In the depicted embodiment, securing features 307a,b are blind holes (e.g., pockets). A similar set of securing features 307c are found on the opposing rear side of transaction card 300 in FIG. 3B. The geometries of opening 305 and securing features 307a, b, c were selected to improve the RF performance of the metal transaction card 300. Securing features 307a, b, c may comprise a material that is the same or otherwise compatible with the molding material, and different than the card body material, such that the molding material and the materials of the securing features melt or otherwise join together with a bond that is relatively stronger than any bond created between the molding material and the card body.

FIG. 3C depicts the front side of the transaction card 300 after an insert molded electronic component 310 has been placed into opening 305. In the depicted embodiment, molded electronic component 310 would be visible on transaction card 300. The geometry of molded electronic component 310 permits molded electronic component 310 to become secured to transaction card 300 through a biasing action created by securing features 307a,b,c. Alternatively, or additionally, molded electronic component 310 may be adhered to opening 305 of transaction card 300 using an epoxy resin such as Bisphenol, Novolac, Aliphatic, and Glycidylamine.

Excess molding material may be removed from molded electronic component 310 (by, e.g., milling or machining) to incorporate additional electronic components or other desired components.

Figure 4B:
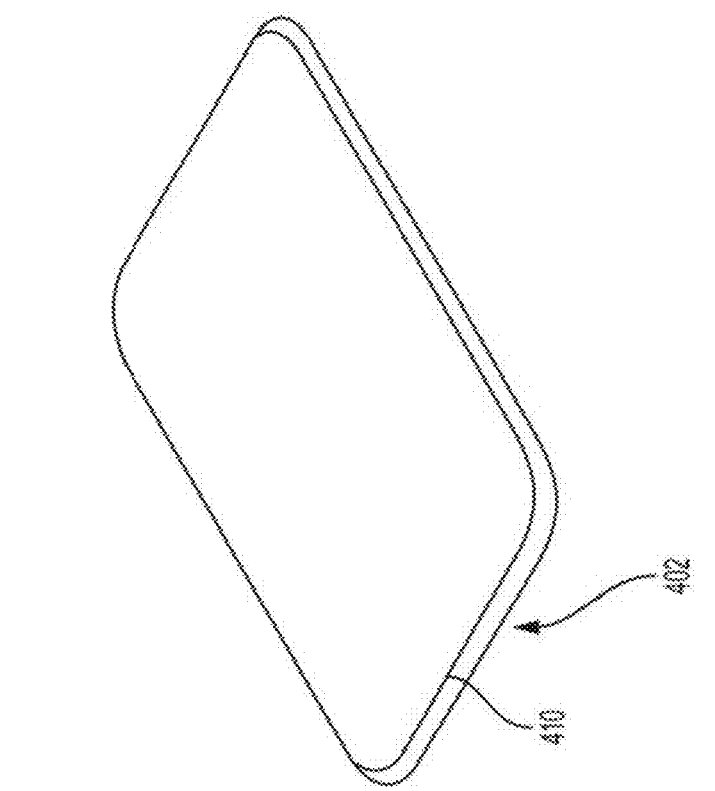
FIGS. 4A and 4B are schematic illustrations of selected steps of an over molding process for manufacturing a transaction card in accordance with aspects of the present invention.
Figure 4A:
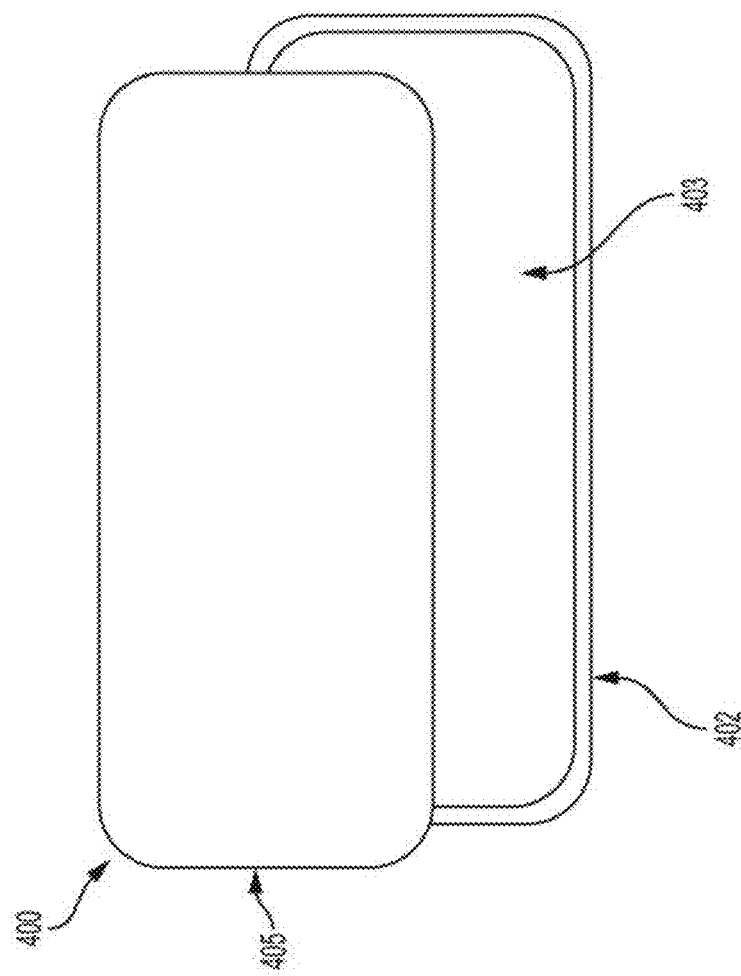

FIG. 4A depicts an exemplary overmolding process in which a pocket 403 is machined into card body 402 for receiving an electronic component 405. In the depicted embodiment electronic component 405 is a printed circuit board (PCB), specifically an RFID module. While pocket 403 is depicted as traversing a substantial portion of the rear face of card body 402, one of ordinary skill in the art will understand the smaller openings of varying geometries may be suitable depending upon the electronic component to be incorporated.

Pocket 403 may be sized to receive and fix into position electronic component 405, or it may be sized to permit excess molding material between the inner lip of pocket 403 and the outer edge of electronic component 405. Electronic component 405 may additionally, or alternatively, be adhered to pocket 403 using an epoxy as described above.

Overmolded faceplate 410 creates the back face of transaction card 400. Overmolded faceplate 410 may completely or partially encapsulate electronic component 405. Overmolded faceplate 410 may be prepared separately and then attached to pocket 403 (using, e.g., a suitable epoxy as described above), or it may be formed by overmolding layers of molding material directly into pocket 403.

In an exemplary embodiment, the molding material used in overmolded faceplate is a plastic material which may enhance RF transmission where transaction card 400 is comprised of a metal or other RF-interfering material.

As is known in the art, transaction cards with RFID chip modules for inductively coupling with a card reader of a point of sale (POS) terminal also typically have an embedded booster antenna structure configured that inductively couples the embedded antenna to the RFID chip module, with the coupled antenna, RFID module, and card reader forming a circuit for transmitting information from the card to the card reader. Thus, in an exemplary embodiment in which the RFID module is the encapsulated or partially encapsulated component (or one of a plurality of electronic components that are processed as described herein), the antenna structure may be provided in any number of ways. In one embodiment, the antenna structure may be embedded in a layer that is applied to the card after the molding processes described herein. The antenna-bearing layer may be laminated to the card using a non-heat process (such as with an adhesive), a heat lamination process conducted at a temperature, pressure, and duration that does not re-melt, deform, or otherwise detrimentally disturb the molding over the electronic component(s), or a backing sheet (comprising metal or some other material not affected by the heat lamination) may be provided during such a heat lamination step to prevent any re-melt or deformation of the molding from protruding from the opposite surface upon which the lamination step is being performed.

In another embodiment, the molding step may comprise an overmolding step that covers not only the electronic component as described herein, but also at least the portion of the card surface into which the antenna structure is to be later disposed. For example, a flood overmolding step may be conducted that, in addition to encapsulating or partially encapsulating the RFID module, also covers at least one entire surface (typically back, but also or instead may be the front) of the card in a layer having a desired thickness. The antenna may then be embedded, such as using ultrasonic processes known in the art, into that overmolded layer. Any content to be printed on the surface of the card may also be printed on the overmolded layer surface, or an additional printing layer may be attached, such as via adhesive or lamination. In other embodiments, the antenna may be printed on the molding surface, or applied as part of another layer that is attached over the molded surface, such as with adhesive or by lamination. The foregoing are non-limiting examples, and it should be understood that infinite possibilities exist for downstream processing of the resulting product of the processes described herein for providing a molded electronic component in a card, and certain aspects of the invention are not limited in any way by later process steps.

Figure 5A:
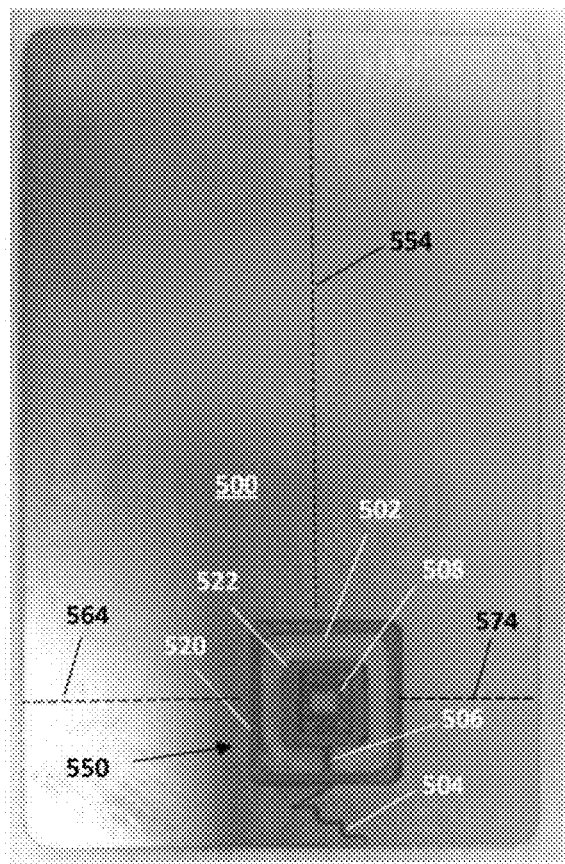
FIG. 5A is an image depicting the front side of an exemplary card having an encapsulated antenna surrounding the payment module.
Figure 5B:
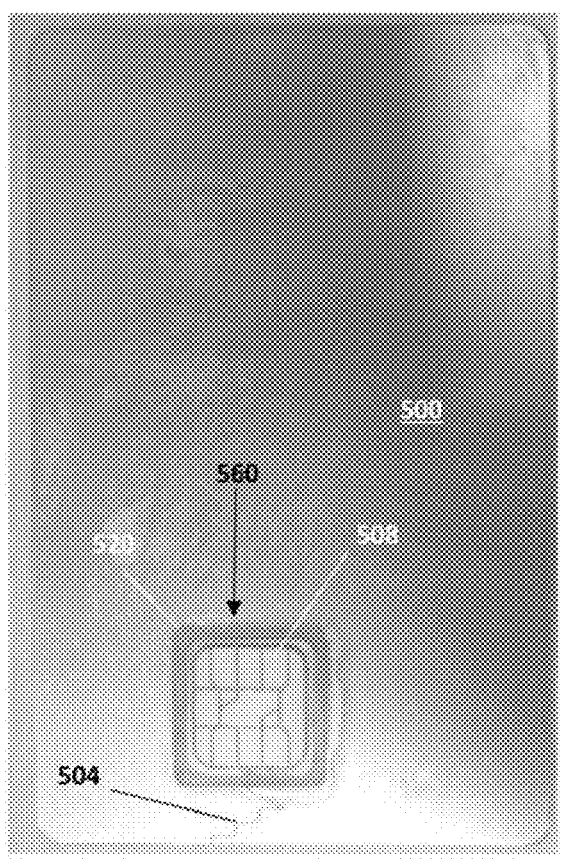
FIG. 5B is an image depicting the back side of the exemplary card of FIG. 5A.
Figure 5C:
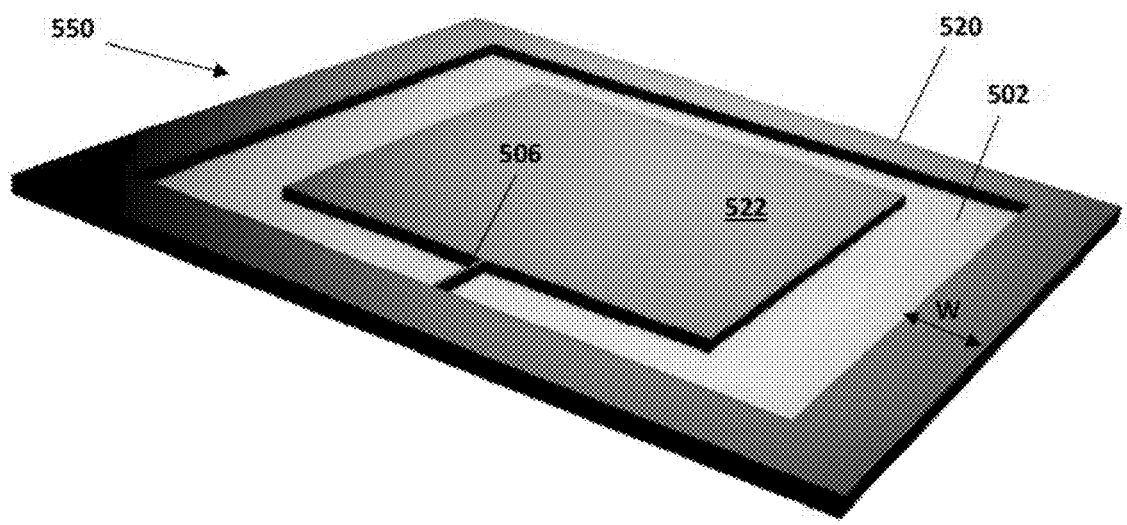
FIG. 5C is an perspective view of an isolated exemplary encapsulated antenna module prior to insertion of the payment module therein.

In another embodiment, illustrated in FIGS. 5A-5C, a booster antenna 502 for inductively coupling with the antenna of a payment module may take the form of an annular metal frame that nearly surrounds the payment module (e.g. a dual interface (DI) RFID chip). As depicted in FIGS. 5A-5C, the antenna has a discontinuity or slit 506 that extends from an inner edge to an outer edge of the annular antenna. Such an antenna has been generally described and characterized as an "amplifier" in U.S. Pat. No. 8,608,082 ('082 patent) to Le Garrec et al. and a "coupling frame" in U.S. Pat. No. 9,812,782 (and others), to Finn et al., incorporated herein by reference. As described in the foregoing, and in U.S. patent application Ser. No. 15/928,813, filed Mar. 22, 2018, titled DI CAPACITIVE EMBEDDED METAL CARD, assigned to the common assignee of the present invention, and incorporated herein by reference, a metal card body itself may serve as such an antenna or amplifier, with a slit (e.g. 504, as depicted in FIGS. 5A and 5B) extending from the periphery of the card to the pocket in which the payment module is mounted. The slit may have any geometry, including but not limited to the stepped shape depicted in FIGS. 5A and 5B, any geometry described in the '813 application and related applications, or any geometry disclosed in the foregoing references.

As shown in FIG. 5C, metal antenna 502 is surrounded by the encapsulating materials to form an outer surround 520 and an inner region 522, and the encapsulant also fills the slit 506 connecting the inner region to the outer surround. For illustrative purposes, the antenna is depicted in FIG. 5C without encapsulating materials covering it in the Z direction, so that the antenna remains visible in the depiction. In embodiments in which a metal body 500 of the card also is harnessed for signal amplification, the encapsulating material may also fills the slit 504 in the metal body. It should be understood, however, that slit 504 may not be present in all embodiments. It should further be understood that the card body may have more than one slit. Exemplary alternative additional slit locations 554, 564, 574 are depicted in dashed lines. For example, in one embodiment, the combination of slits 504 and 554 intersecting with the chip pocket may form a bisection along the full length of the card, or the combination of slits 564 and 574 intersecting with the chip pocket may together form a bisection along the full width of the card. It should be noted here that the term "bisect" is intended to mean that the line divides the card into two sections, but those sections are not necessarily equal in size. Although depicted generally centered on the antenna aligned to the same line on opposite sides of the antenna, the combined slits may have any relationship to the antenna and to each other, including a relationship wherein the slits on different sides of the antenna lie on parallel or non-parallel lines, relationships in which the slits connect to adjacent rather than opposite sides of the antenna, relationships wherein the slits are not parallel to an edge of the card, or relationships wherein one or both of the slits are non-linear. For embodiments in which the card is bisected, the remaining pieces of the card may be bonded together by overmolding or other nonconductive adhesives or fillers. Although a preferred embodiment includes only a single bisection of the card body into two discrete portions, a plurality of body slits may divide the card into more than two discrete portions. Bisected arrangements, generally, may minimize eddy currents.

Thus, antenna 502 as encapsulated as depicted in FIG. 5C defines a metal containing plug 550, which may either be created in its entirety and then inserted in an opening in the card body, or may be created in situ in the opening in the card body, such as by overmolding. After the plug is inserted in the pocket or molded in situ, a pocket may be created in the inner region 522 of the plug (e.g. by milling or any process known in the art) to receive the payment module. Among the advantages of such a design is that the metal card body may be formed with a through hole for receiving plug 550. Preferably, the through-hole may be formed by methods other than milling, such as stamping, etching, laser cutting, or the like. Or, the card body may be formed initially with a through-hole, which may be particularly advantageous for a card body that is ceramic, cast metal, or metal-doped epoxy (such as is described in U.S. Provisional Application Ser. No. 67/730,282, filed Sep. 12, 2018, titled METAL-DOPED EPOXY RESIN TRANSACTION CARD AND PROCESS FOR MANUFACTURE, assigned to the common assignee of the present application, and incorporated herein by reference). Then, the milling step to create the pocket to receive the payment module need only be performed in a non-metal encapsulating material, which is easier and takes less time to mill than metal. As is known in the art, the pocket for receiving the payment module may be a stepped hole having a first, relatively greater area on the front surface of the card, and a second, relatively lesser area on the back side of the card. By enlarging the area of the pocket in the card body into which the payment module is inserted, the overall length of the slit 504 that must be cut into the metal card body (in embodiments in which the slit is present), can be minimized, also saving manufacturing time. The foregoing improvements foster increased output and efficiency.

In some embodiments, it may not be necessary or desired for the card body to serve as part of the booster antenna. In such embodiments, the opening in the card body may be relatively larger than as depicted in FIGS. 5A-5C, such that outer surround 520 has a width W separating the metal of the antenna 502 in the plug 550 from the card body that is operable to acceptably minimize electrical/magnetic interference from the card body. The geometry of the plug 550 in such embodiments may be more rectangular, with the innermost edge 560 of the plug positioned more towards the center of the card body 500 to guide some of the RF signal towards the center of the card, while the location of the DI payment module remains essentially unchanged as depicted, to conform to the relevant standard for the position of the contacts.

Although described herein in connection with a metal card body, similar geometries may be employed in non-metal cards. In addition to the methods of manufacture described herein, which are suitable for card bodies of any materials (although particularly advantageous for metal, ceramic, and ceramic-coated-metal bodies), antenna 502 may be deployed in a plastic (e.g. PVC) card body, for example, by ultrasonically (or otherwise) embedding the metal component into the plastic as an inlay within the card, thus replacing copper wire or etched antenna inlays. The antenna geometry 502 as depicted can be described as a planar, annular member having a nearly closed periphery, with a slit 506 that connects the inner periphery with the outer periphery of the annulus. Although depicted in the exemplary embodiment as a single member, the antenna structure is not so limited and may comprise more than one member. By contrast, copper wire or etched antenna inlays typically create a spiral pattern of lines or wires with spaces radially separating the whorls of the spiral.

One of ordinary skill in the art will understand that suitable molding materials will depend upon the type of molding process used in step 130. For example, where insert or overmolding is employed, thermoplastic materials such as TechnoMelt® meltable adhesive (Henkel), which may include one or more materials from the group consisting of: EVA, metallocene polyalphaolefins, polyolefins including atactic polyalphaolefins, block copolymers, polyurethane hot melts, and polyamides and thermoset materials such as fiberglass reinforced polyester, polyurethane, bakelite, duroplast, melamine, Diallyl-phthalate, and polyamide may be used. One of ordinary skill in the art will understand that other materials which can be rendered flowable in an over-molding or insert molding process may be used as well including, but not limited to, powdered metals such as Rhodium, Aluminum, Titanium, Magnesium, Copper, Brass, Nickel, Monel, Inconel, Steels and alloys of the above.

In another embodiment, the molding material used in the overmolding or insert molding process is a plastic material having a molding temperature range of approximately 150-300 C.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A transaction card comprising:
   a metal card body having a length and a width that define opposite faces having a thickness between the opposite faces, and an opening in the card body;
   a payment module having a first antenna;
   a booster antenna disposed in the opening and configured to inductively couple to the first antenna, the booster antenna comprising a metal, annular member having a discontinuity that connects an inner region defined by the annular member to an outer region that surrounds the annular member and
   a non-metal molding material disposed about at least one surface of the booster antenna, the non-metal molding material disposed in the discontinuity, the inner region, and the outer region of the booster antenna, wherein the payment module is secured in a pocket defined in the molding material in the inner region of the antenna.

2. The transaction card of claim 1, wherein the card body has at least one body discontinuity extending from an outer periphery of the card body to the opening in the card body.

3. The transaction card of claim 2, wherein the molding material is disposed in the at least one body discontinuity.

4. The transaction card of claim 2, comprising at least two body slits, wherein the at least two body slits and the opening collectively bisect the card body into at least two discrete portions.

5. The transaction card of claim 1, wherein the card body has different materials of construction than the molding material, wherein the molding material has a coloration tailored to match a coloration of the body.

6. The transaction card of claim 1, wherein the molding material is a plastic having a molding temperature range of approximately 150-300 C.

7. The transaction card of claim 1, wherein the molding material is one or more of EVA, metallocene polyalphaolefins, polyolefins including atactic polyalphaolefins, block copolymers, polyurethane hot melts, polyamides, fiberglass reinforced polyester, polyurethane, bakelite, duroplast, melamine, Diallyl-phthalate, and polyimide.

8. The transaction card of claim 1, wherein the molding material comprises a resin including powdered metal.

9. The transaction card of claim 8, wherein the powdered metal is selected from the group consisting of Rhodium, Aluminum, Titanium, Magnesium, Copper, Brass, Nickel, Monel, Inconel, Steel, alloys of the foregoing, and combinations of the foregoing.

10. The transaction card of claim 9, wherein the powdered metal included in the resin and the metal of the card body comprise the same type of metal or alloy thereof.

11. The transaction card of claim 1, further comprising at least one securing feature comprising at least one pocket in the card body that interfaces with at least one corresponding securing member of molding material.

12. The transaction card of claim 11, comprising at least a first blind hole pocket open only to a first face of the card body that interfaces with a first securing member and at least a second blind hole pocket open only to a second face of the card body that interfaces with a second securing member.

13. The transaction card of claim 1, wherein the opening in the card body extends entirely through the thickness of the card body.

14. The process of claim 1, wherein the opening in the card body defines a pocket in the card body that extends only partially through the thickness of the card body.

15. The transaction card of claim 14, wherein the card body has an outer periphery, a first face, and a pocket opposite the first face, the pocket having an inner lip that defines a perimeter of the pocket adjacent the outer periphery of the card body, and the molding material covers at least one surface of the antenna and extends between the inner lip of the pocket and an outer edge of the antenna to create a faceplate that defines an entire back face of the transaction card opposite the first face of the card body.

16. A process for manufacturing a transaction card of claim 1, comprising the steps of:
    (a) forming the opening in the card body;
    (b) inserting the antenna into the opening; and
    (c) molding the molding material about the antenna.

17. The process of claim 16, comprising the step of creating at least one body discontinuity extending from an outer periphery of the card body to the opening in the card body.

18. The process of claim 17, comprising the step of disposing the molding material in the at least one body discontinuity.

19. The process of claim 16, wherein the molding step comprises inserting the antenna into the opening and then filling the opening with the molding material.

20. The process of claim 19, comprising disposing the molding material in the at least one body discontinuity at a same time as filling the opening with the molding material.

21. The process of claim 19, wherein the card body has an outer periphery, a first face, and a pocket opposite the first face, the pocket having an inner lip that defines a perimeter of the pocket adjacent the outer periphery of the card body, and the process comprises first inserting the antenna into the pocket and then filling the pocket with the molding material such that the molding material covers at least one surface of the antenna and extends between the inner lip of the pocket and an outer edge of the antenna to create a faceplate that defines an entire back face of the transaction card opposite the first face of the card body.

22. The process of claim 16, wherein the molding step comprises placing the antenna into a mold and injecting the molding material into the mold.

23. The process of claim 22, wherein the transaction card has one or more securing features and the process comprising molding the molding material about the antenna by placing the antenna in a mold and adding the molding material to completely encapsulate the antenna, the process comprising performing steps (a) and (c) before step (b), and in step (b) inserting and securing the completely encapsulated antenna into the opening in the card body, including using the interface between a respective first securing member and a first pocket and second securing member and a second pocket for securing the molding material to the card body.

24. The process of claim 22 further comprising, after the molding step, the step of removing excess molding material from the molded electronic component.

25. The process of claim 22, wherein step (a) comprises forming a pocket extending only partially through the card body and having an inner lip that defines a perimeter of the pocket adjacent an outer periphery of the card body, and step (c) comprises molding the molding material about the antenna by placing the antenna in a mold and adding the molding material to completely encapsulate the antenna, forming a faceplate configured to define one face of the transaction card that includes molding material extending between the inner lip of the pocket and an outer edge of the electronic component, and the process comprises performing steps (a) and (c) before step (b), and performing step (b) by inserting and adhesively attaching the faceplate in the card pocket.

* * * * *